(12) United States Patent
Zhu et al.

(10) Patent No.: US 8,907,374 B2
(45) Date of Patent: Dec. 9, 2014

(54) INSULATED GATE BIPOLAR TRANSISTOR

(71) Applicant: Huawei Technologies Co., Ltd., Shenzhen (CN)

(72) Inventors: Yisheng Zhu, Shenzhen (CN); Jinping Zhang, Shenzhen (CN)

(73) Assignee: Hauwei Technologies Co., Ltd., Shenzhen (CN)

(*) Notice: Subject to any disclaimer, the term of this patent is extended or adjusted under 35 U.S.C. 154(b) by 0 days.

(21) Appl. No.: 14/134,066

(22) Filed: Dec. 19, 2013

(65) Prior Publication Data
US 2014/0209971 A1 Jul. 31, 2014

Related U.S. Application Data

(63) Continuation of application No. PCT/CN2013/080963, filed on Aug. 7, 2013.

(30) Foreign Application Priority Data

Jan. 30, 2013 (CN) .......................... 2013 1 0037476

(51) Int. Cl.
H01L 29/06 (2006.01)
H01L 29/739 (2006.01)
H01L 29/08 (2006.01)

(52) U.S. Cl.
CPC ........ *H01L 29/0619* (2013.01); *H01L 29/7395* (2013.01); *H01L 29/7397* (2013.01); *H01L 29/0623* (2013.01); *H01L 29/0653* (2013.01); *H01L 29/0834* (2013.01)
USPC ........................................................ 257/139

(58) Field of Classification Search
CPC ............ H01L 29/0619; H01L 29/7395; H01L 29/7397; H01L 29/0623; H01L 29/0653; H01L 29/0834

USPC ........................................................ 257/139
See application file for complete search history.

(56) References Cited

U.S. PATENT DOCUMENTS

2009/0184338 A1* 7/2009 Hisamoto .................... 257/139
2012/0068310 A1 3/2012 Uemura

FOREIGN PATENT DOCUMENTS

| CN | 102005473 | 4/2011 |
| CN | 102779840 | 11/2012 |
| CN | 103094332 | 5/2013 |

OTHER PUBLICATIONS

International Search Report, dated Nov. 14, 2013, in corresponding International Application No. PCT/CN2013/080963 (12 pp.).

* cited by examiner

*Primary Examiner* — Walter H Swanson
(74) *Attorney, Agent, or Firm* — Staas & Halsey LLP

(57) ABSTRACT

Embodiments of the present invention provide an IGBT, which relates to the field of integrated circuit manufacturing, and may improve a problem of tail current when the IGBT is turned off. The IGBT includes a cell region on a front surface, a terminal region surrounding the cell region, an IGBT drift region of a first conductivity type, and an IGBT collector region on a back surface. The IGBT collector region is connected to the IGBT drift region and under the IGBT drift region. The IGBT drift region includes a first drift region under the cell region and a second drift region under the terminal region. The IGBT collector region includes a cell collector region of a heavily doped second conductivity type under the first drift region and a non-conductive isolation region adjacent to the cell collector region.

12 Claims, 10 Drawing Sheets

INSULATED GATE BIPOLAR TRANSISTOR

CROSS-REFERENCE TO RELATED APPLICATIONS

This application is a continuation of International Application No. PCT/CN2013/080963, filed on Aug. 7, 2013, which claims priority to Chinese Patent Application No. 201310037476.8, filed on Jan. 30, 2013, both of which are hereby incorporated by reference in their entireties.

TECHNICAL FIELD

The present invention relates to the field of integrated circuit manufacturing, and in particular, to an insulated gate bipolar transistor.

BACKGROUND

An insulated gate bipolar transistor (IGBT) is a composite full-controlled voltage-driven power semiconductor component composed of a bipolar junction transistor (full name: Bipolar Junction Transistor, briefed as BJT) and a metal-oxide-semiconductor-field effect transistor (Metal-Oxide-Semiconductor Field-Effect Transistor, MOSFET).

In a conventional IGBT structure, there are two opposite primary surfaces, namely, a first primary surface and a second primary surface. The first primary surface is a front surface of a chip, and includes a cell region and a terminal region; and the second primary surface is a back surface of the chip, includes an IGBT collector region, and in addition, also includes an IGBT drift region.

FIG. 1 is a top view of a conventional IGBT structure, that is, a schematic diagram of a front surface of a chip, including a cell region 100 and a terminal region 200, where the terminal region 200 completely surrounds the cell region 100, implementing a function of electric field voltage division of a chip plane. FIG. 2 is a cross-sectional diagram of FIG. 1 along an A-A line. As shown in FIG. 2, the cell region 100 includes a gate 101, an emitter 102, a p well region 103, an n+ emitter region 104 and a p+ emitter region 105 which are contained in the p well region 103 and contact the emitter, a gate region 107, a gate oxidation region 106, and an oxide isolation layer region 206. Multiple gate regions 107 are connected together by using metal to form the gate 101 of the IGBT. The p well region 103, and the n+ emitter region 104 and the p+ emitter region 105 which are contained in the p well region 103, are connected together by using metal to form the emitter 102 of the IGBT. The terminal region 200 includes a first field ring p region 201, several field ring p regions 202, a p+ region 204 connected to the emitter 102, a field plate region 205, an equipotential ring n region 203 at an edge of the chip, and an oxide isolation layer region 206.

As shown in FIG. 2, the back surface of the chip includes an IGBT collector region 301 and a collector metalization region 300, where the IGBT collector region 301 is p+. The collector metalization region 300, the gate 101, and the emitter 102 form three electrode ports of the IGBT.

In addition, as shown in FIG. 2, a first drift region 108 is under the cell region 100, and a second drift region 207 is under the terminal region 200. The first drift region 108 and the second drift region 207 are jointly called an IGBT drift region, where the IGBT drift region is n−.

The IGBT is a large power switching component, with key features of switching feature parameters and high reliability. Generally, when the IGBT is forward conductive, a positive gate voltage makes a channel formed, and electrons of the emitter flows to the drift region via the channel. Due to requirements of forward bias and electric neutrality of the collector, a large number of holes are injected from the collector to the drift region, and form conductivity modulation with electrons in the drift region. Because of the conductivity modulation effect when the IGBT is forward conductive, the IGBT has advantages of a low forward conduction voltage drop, a large on-state current, and low loss.

However, when the IGBT is turned off, and after the gate voltage is reduced to be smaller than a threshold voltage, the channel is cut off, and an electron current of the emitter turns to zero. In circumstances of widely applied inductive loads, because an inductive current cannot be suddenly changed, which means that a current flowing through the IGBT cannot be changed suddenly, all currents flowing through the IGBT must be provided by a hole current formed by the holes injected from the collector to the drift region. In this case, for the terminal region of the IGBT component, a large number of holes are injected from the collector of the component to the drift region. However, the injected holes cannot be directly pumped out from a floating field ring structure of the terminal, but gather at the equipotential ring of the terminal, resulting in a longer hole recombination time, a lower turn-off speed, and greater turn-off loss. In addition, a local gathering effect of the hole current is formed at the equipotential ring of the terminal, which causes a high voltage and a strong current and makes a component temperature rise rapidly, resulting in dynamic avalanche breakdown and thermal breakdown of the component and burning of the component.

SUMMARY

Embodiments of the present invention provide an insulated gate bipolar transistor, which can improve turn-off loss and reliability of an IGBT.

In order to achieve the foregoing objective, the following technical solution is adopted in the embodiments of the present invention.

In one aspect, an IGBT is provided, including a cell region on a front surface, a terminal region surrounding the cell region, an IGBT drift region of a first conductivity type, and an IGBT collector region on a back surface, where: the IGBT collector region is connected to the IGBT drift region, and is under the IGBT drift region, where the IGBT drift region includes a first drift region under the cell region and a second drift region under the terminal region; and the IGBT collector region includes a cell collector region of a heavily doped second conductivity type under the first drift region and a non-conductive isolation region adjacent to the cell collector region, where a length of the non-conductive isolation region is smaller than or equal to a length of the terminal region, and a thickness of the non-conductive isolation region is larger than or equal to a thickness of the cell collector region.

In a first possible implementation manner, the IGBT collector region further includes a terminal collector region adjacent to the non-conductive isolation region, where the terminal collector region includes a first block of a second conductivity type and a second block of a heavily doped first conductivity type under the first block, where: a length of the first block is smaller than or equal to the length of the terminal region, and a thickness of the first block is smaller than a thickness of the second drift region; and a length of the second block is smaller than or equal to the length of the terminal region, and a thickness of the second block is smaller than the thickness of the non-conductive isolation region.

With reference to the first possible implementation manner, in a second possible implementation manner, a doping density of the second conductivity type of the first block is light doping or heavy doping.

With reference to the first possible implementation or the second possible implementation manner, in a third possible implementation manner, the terminal collector region further includes a third block of the first conductivity type, which is adjacent to the first block and over the second block, where a length of the third block is smaller than the length of the terminal region, and a thickness of the third block is equal to the thickness of the first block.

With reference to the third possible implementation manner, in a fourth possible implementation manner, a doping density of the first conductivity type of the third block is the same as a doping density of the IGBT drift region.

With reference to all the foregoing possible implementation manners, in a fifth possible implementation manner, in a situation where a part of the non-conductive isolation region is under the first drift region, a length of the part of the non-conductive isolation region under the first drift region is no more than a length of three cells of a corresponding cell region.

In a sixth possible implementation manner, the non-conductive isolation region may be in a shape of a rectangle, trapezoid, or triangle.

In a seventh possible implementation manner, a filling material of the non-conductive isolation region includes silicon dioxide, or silicon nitride, or a mixture of silicon dioxide and silicon nitride, or a compound of nitride, silicon, and oxygen, or a non-conductive organic matter.

In an eighth possible implementation manner, the IGBT is a planar gate IGBT or a trench gate IGBT.

With reference to all the foregoing possible implementation manners, in a ninth possible implementation manner, the first conductivity type is n type, and the second conductivity type is p type.

The IGBT provided in the embodiments of the present invention includes a cell region, a terminal region, an IGBT drift region, and an IGBT collector region which is connected to the IGBT drift region and under the IGBT drift region. The IGBT drift region includes a first drift region under the cell region and a second drift region under the terminal region. The IGBT collector region includes a cell collector region of a heavily doped second conductivity type under the first drift region and a non-conductive isolation region adjacent to the cell collector region. Because the cell collector region is of the heavily doped second conductivity type, an operating current of the IGBT can be ensured. When the IGBT is turned off, due to existence of the non-conductive isolation region, holes injected to the second drift region under the terminal region are decreased, thereby reducing a turn-off time of hole recombination, and further reducing turn-off loss. In addition, a component can be prevented from being burned down as a result of a local gathering effect, thereby improving turn-off reliability of the component.

REFERENCE NUMERALS IN THE DRAWINGS ARE AS FOLLOWS

Figure 1:
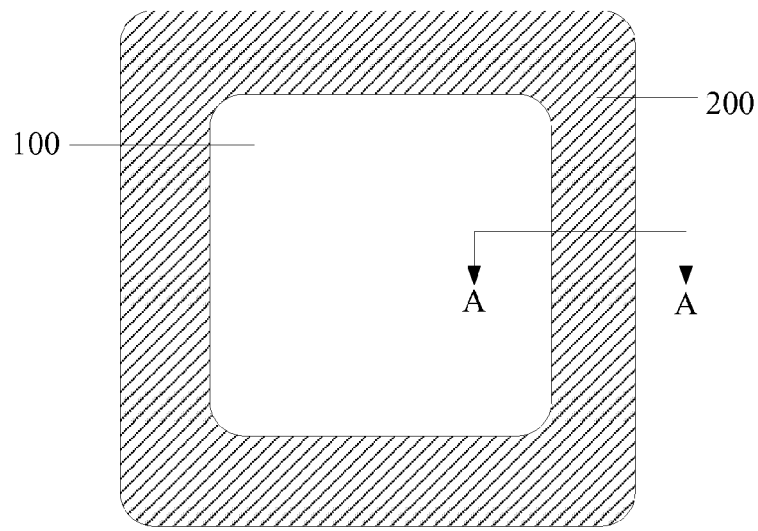
FIG. 1 is a schematic diagram of a top view of an IGBT in a prior art.
Figure 2:
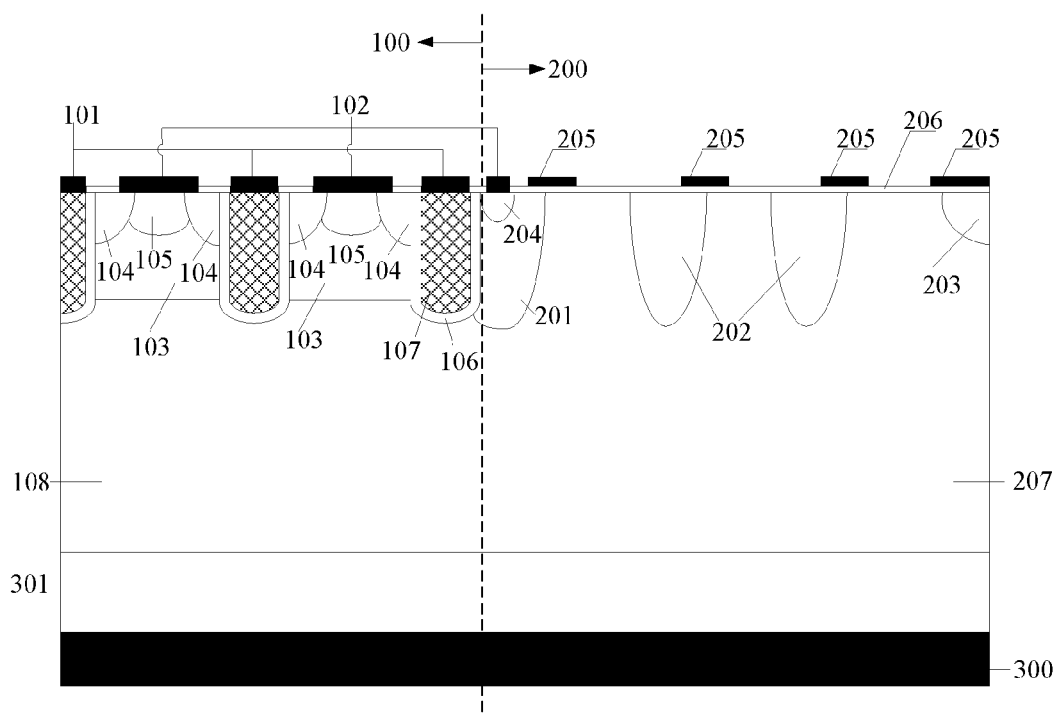
FIG. 2 is a schematic diagram of a lateral view of the IGBT along an A-A line in the prior art.

100: cell region; 101: gate; 102: emitter; 103: p well region; 104: n+ emitter region; 105: p+ emitter region; 106: gate oxidation region; 107: gate region; 108: first drift region; 200: terminal region; 201: first field ring p region; 202: field ring p region; 203: equipotential ring n region; 204: p+ region; 205: field plate region; 206: oxide isolation layer region; 207: second drift region; 300: collector metalization region; 301: IGBT collector region, 302: cell collector region; 303: non-conductive isolation region; 304: terminal collector region, 304a: first block, 304b: second block, and 304c: third block.

DESCRIPTION OF EMBODIMENTS

The following clearly describes the technical solutions in the embodiments of the present invention with reference to the accompanying drawings in the embodiments of the present invention. Apparently, the described embodiments are merely a part rather than all of the embodiments of the present invention. All other embodiments obtained by a person of ordinary skill in the art based on the embodiments of the present invention without creative efforts shall fall within the protection scope of the present invention.

Embodiments of the present invention provide an IGBT, including a cell region on a front surface, a terminal region surrounding the cell region, an IGBT drift region of a first conductivity type, and an IGBT collector region on a back surface. The IGBT collector region is connected to the IGBT drift region and under the IGBT drift region. The IGBT drift region includes a first drift region under the cell region and a second drift region under the terminal region. The IGBT collector region includes a cell collector region of a heavily doped second conductivity type under the first drift region and a non-conductive isolation region adjacent to the cell collector region. A length of the non-conductive isolation region is smaller than or equal to a length of the terminal region, and a thickness of the non-conductive isolation region is larger than or equal to a thickness of the cell collector region.

It should be noted that, the conductivity types in the embodiments of the present invention need to be determined according to a majority of current carriers in a semiconductor. If the majority of current carriers of the first conductivity type are holes, the first conductivity type is p type, a heavily doped first conductivity type is p+ type, and a lightly doped first conductivity type is p− type. If the majority of current carriers of the first conductivity type are electrons, the first conductivity type is n type, the heavily doped first conductivity type is n+ type, and the lightly doped first conductivity type is n− type. The same applies to the second conductivity type. When the first conductivity type is n type, the second conductivity type is p type. In all embodiments of the present invention, an example where the first conductivity type is n type and the second conductivity type is p type is taken for description.

In addition, in the embodiments of the present invention, the "under" means that, viewed from a lateral view direction, an upper one is "over", and a lower one is "under"; and the "adjacent" means being next to a certain reference object on the left or right side when viewed from a lateral view direction by taking the reference object for reference.

The IGBT provided in the embodiments of the present invention includes a cell region, a terminal region, an IGBT drift region, and an IGBT collector region which is connected to the IGBT drift region and under the IGBT drift region. The IGBT drift region includes a first drift region under the cell region and a second drift region under the terminal region. The IGBT collector region includes a cell collector region of a heavily doped second conductivity type under the first drift region and a non-conductive isolation region adjacent to the cell collector region. Because the cell collector region is of the heavily doped second conductivity type, an operating current of the IGBT can be ensured. When the IGBT is turned off, due to existence of the non-conductive isolation region, holes injected to the second drift region under the terminal region are decreased, thereby reducing a turn-off time of hole recombination, and further reducing turn-off loss. In addition, a component can be prevented from being burned down as a result of a local gathering effect, thereby improving turn-off reliability of the component.

Figure 3:
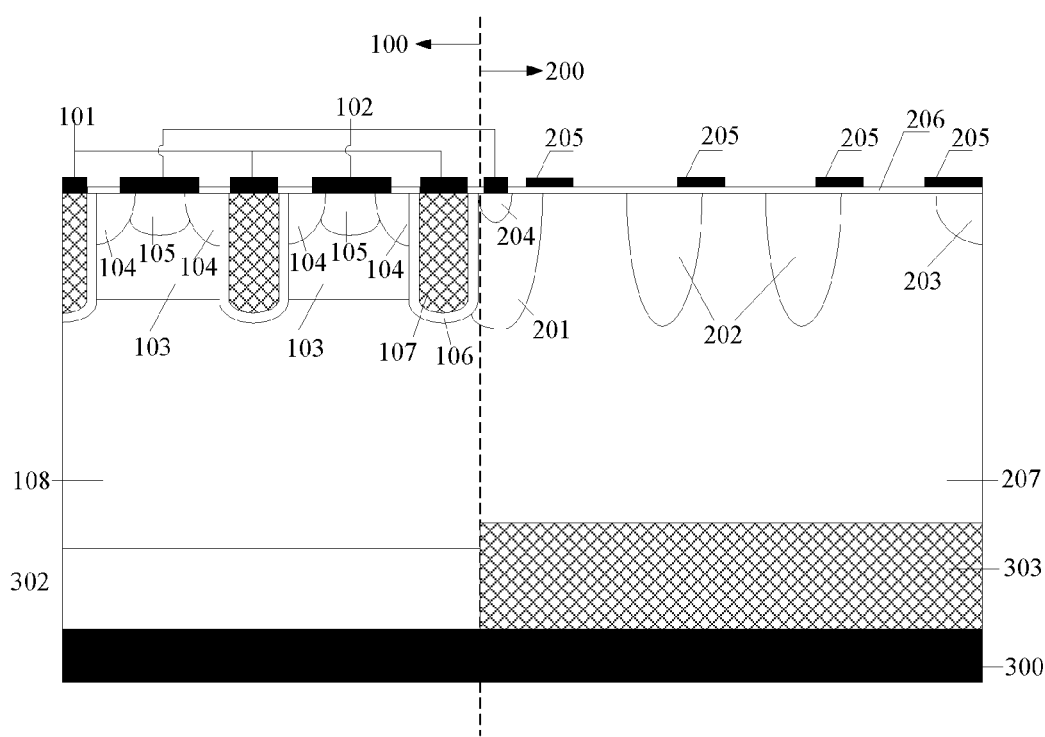
FIG. 3 is a schematic structural diagram of a trench gate type IGBT according to a first embodiment of the present invention.

In a first embodiment, as shown in FIG. 3, an IGBT provided by the first embodiment of the present invention includes a cell region 100 and a terminal region 200 surrounding the cell region. The cell region 100 includes a gate 101, an emitter 102, a p well region 103, an n+ emitter region 104 and a p+ emitter region 105 which are contained in the p well region 103 and contact the emitter, a trench type gate region 107, a gate oxidation region 106, and an oxide isolation layer region 206. Multiple trench type gate regions 107 are connected together by using metal to form the gate 101 of the IGBT. The p well region 103, and the n+ emitter region 104 and the p+ emitter region 105 which are contained in the p well region 103, are connected together by using metal to form the emitter 102 of the IGBT. The terminal region 200 includes a first field ring p region 201, several field ring p regions 202, a p+ region 204 connected to the emitter 102, a field plate region 205, an equipotential ring n region 203 at an edge of the chip, and an oxide isolation layer region 206.

The IGBT further includes a first drift region 108 under the cell region 100 and a second drift region 207 under the terminal region 200. The first drift region 108 and the second drift region 207 are jointly called an IGBT drift region, where the IGBT drift region is n−.

The IGBT further includes a collector metalization region 300 on a back surface of the chip and an IGBT collector region 301 which is connected to the IGBT drift region and under the IGBT drift region. The IGBT collector region 301 includes a p+ cell collector region 302 under the first drift region 108 and a non-conductive isolation region 303 adjacent to the cell collector region 302. A length of the non-conductive isolation region 303 is equal to a length of the terminal region 200, and the non-conductive isolation region 303 is completely under the second drift region 207. A thickness of the non-conductive isolation region 303 is larger than or equal to a thickness of the cell collector region 302.

Because the cell collector region is p+, an operating current of the IGBT can be ensured. When the IGBT is turned off, due to existence of the non-conductive isolation region, holes injected to the second drift region under the terminal region are decreased, thereby reducing a turn-off time of hole recombination, and further reducing turn-off loss. In addition, a component can be prevented from being burned down as a result of a local gathering effect that forms a hole current at the equipotential ring, thereby improving turn-off reliability of the component.

It should be noted that, in the embodiment of the present invention, an example where the length of the non-conductive isolation region 303 is equal to the length of the terminal region 200, and the non-conductive isolation region 303 is completely under the second drift region 207 is taken for description, but the embodiment of the present invention is not limited thereto.

Figure 4:
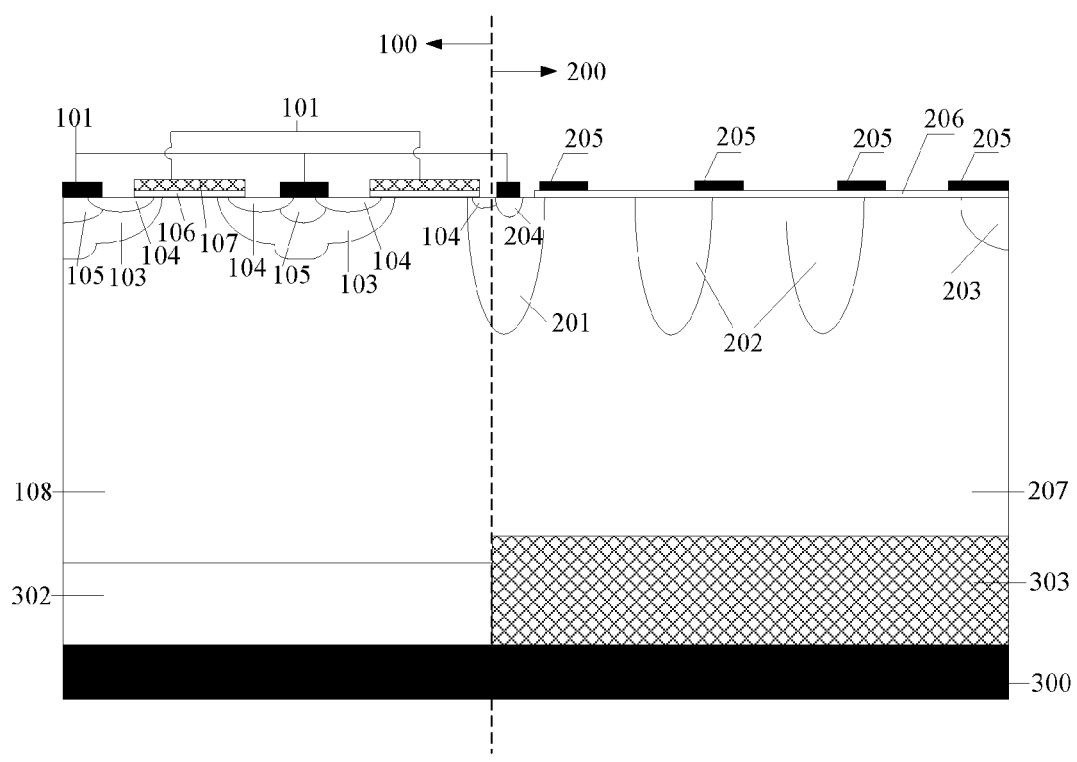
FIG. 4 is a schematic structural diagram of a planar gate type IGBT according to the first embodiment of the present invention.

Nevertheless, the first embodiment of the present invention further provides another IGBT. As shown in FIG. 4, a difference from FIG. 3 lies in that the IGBT in FIG. 4 is a planar gate type IGBT, of which details are not described herein again.

Further, in all embodiments of the present invention, the non-conductive isolation region 303 is in a shape of a rectangle, trapezoid, or triangle.

It should be noted herein that, when the non-conductive isolation region 303 is in a non-rectangular shape, the thickness of the non-conductive isolation region 303 is a height of the shape of the non-conductive isolation region 303. For example, when the non-conductive isolation region 303 is in a shape of a triangle, the thickness thereof is a height of the triangle. For another example, when the non-conductive isolation region 303 is in a shape of a trapezoid, the thickness thereof is a height of the trapezoid. The length of the non-conductive isolation region 303 is a length of a longest bottom line of the shape of the non-conductive isolation region 303. For example, when the non-conductive isolation region 303 is in a shape of a triangle, the length thereof is a length of the bottom line of the triangle. For another example, when the non-conductive isolation region 303 is in a shape of a trapezoid, the length thereof is a length of the longest bottom line of the trapezoid. In all embodiments of the present invention, an example where the non-conductive isolation region 303 is in the shape of a rectangle is taken for illustration, but the embodiments of the present invention are not limited thereto. Nevertheless, the shape of the non-conductive isolation region 303 is not limited to a rectangle, triangle, or trapezoid.

A filling material of the non-conductive isolation region 303, in all embodiments of the present invention, preferably includes silicon dioxide, or silicon nitride, or a mixture of silicon dioxide and silicon nitride, or a compound of nitride, silicon, and oxygen, or a non-conductive organic matter.

In this way, transmission of holes from the cell collector region 302 to the second drift region 207 can be effectively blocked when the IGBT is turned off, thereby reducing the turn-off loss of the IGBT and improving the turn-off reliability.

Nevertheless, the filling material of the non-conductive isolation region 303 may further include other materials, which is not limited herein.

Further, the IGBT collector region further includes a terminal collector region adjacent to the non-conductive isolation region. The terminal collector region includes a first block of a second conductivity type and a second block of a heavily doped first conductivity type under the first block. A length of the first block is smaller than or equal to the length of the terminal region, and a thickness of the first block is smaller than a thickness of the second drift region. A length of the second block is smaller than or equal to the length of the terminal region, and a thickness of the second block is smaller than the thickness of the non-conductive isolation region.

In all embodiments of the present invention, the thickness of the second drift region is preferably 30 μm to 600 μm.

Optionally, a doping density of the second conductivity type of the first block is light doping or heavy doping.

The terminal collector region adjacent to the non-conductive isolation region herein includes the first block of the second conductivity type and the second block of the heavily doped first conductivity type under the first block. In one aspect, the first block of the second conductivity type can prevent a breakdown voltage of the IGBT from being affected, and ensure an appropriate IGBT current. In another aspect, due to the effect of the heavily doped first conductivity type (for example, n) of the second block, an emission efficiency of a majority of current carriers in the first block can be reduced, so that holes injected to the second drift region under the terminal region are decreased, thereby reducing the turn-off time of hole recombination, and further reducing the turn-off loss. In addition, a component can be prevented from being burned down as a result of a local gathering effect that forms a hole current at the equipotential ring, thereby improving turn-off reliability of the component.

In addition, due to existence of the non-conductive isolation region, transmission of the hole current from the cell collector region to the first block can be effectively blocked when the IGBT is turned off, thereby further reducing the turn-off loss of the IGBT and improving the turn-off reliability. Herein, in order not to affect a saturation voltage drop of the IGBT during operation, in a situation where a part of the non-conductive isolation region is under the first drift region, preferably, a length of the part of the non-conductive isolation region under the first drift region is no more than a length of three cells of a corresponding cell region.

It should be noted that the cell mentioned in the embodiment of the present refers to a minimum repeated unit of the IGBT to implement turn-on and turn-off functions, and includes a gate (trench or plane), a gate oxide, a p well region, an n+ emitter region, and a p+ emitter region. The length of three cells herein means that, taking a junction between the cell region and the terminal region as a reference, a cell closest to the junction is called a first cell, and then a second cell, a third cell, and so on in a direction from the junction to the cell region. Therefore, in the embodiment of the present invention, the length of three cells is a distance from the first cell to the third cell.

In addition, the filling material of the non-conductive isolation region includes silicon dioxide, or silicon nitride, or a mixture of silicon dioxide and silicon nitride, or a compound of nitride, silicon, and oxygen, or a non-conductive organic matter. The non-conductive isolation region may be in any shape, such as a rectangle, trapezoid, or triangle.

Figure 5:
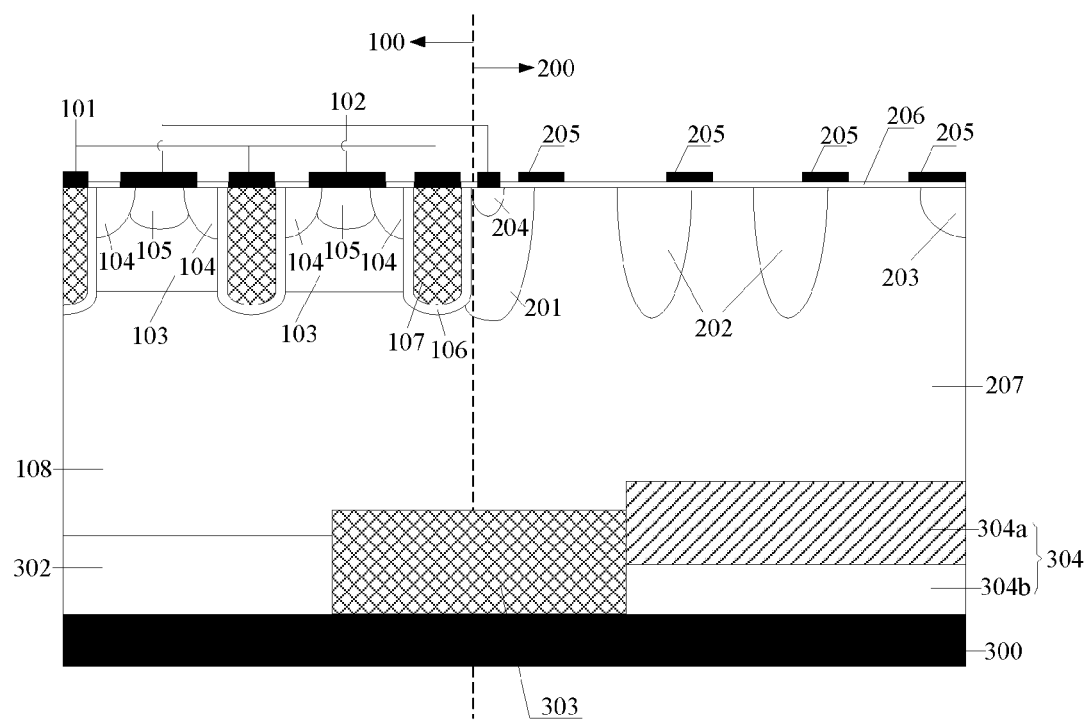
FIG. 5 is a schematic structural diagram of a trench gate type IGBT according to a second embodiment of the present invention.

In a second embodiment, as shown in FIG. 5, an IGBT provided by the second embodiment of the present invention includes a cell region 100 and a terminal region 200 surrounding the cell region. The cell region 100 includes a gate 101, an emitter 102, a p well region 103, an n+ emitter region 104 and a p+ emitter region 105 which are contained in the p well region 103 and contact the emitter, a trench type gate region 107, a gate oxidation region 106, and an oxide isolation layer 206. Multiple trench type gate regions 107 are connected together by using metal to form the gate 101 of the IGBT. The p well region 103, and the n+emitter region 104 and the p+ emitter region 105 which are contained in the p well region 103, are connected together by using metal to form the emitter 102 of the IGBT. The terminal region 200 includes a first field ring p region 201, several field ring p regions 202, a p+ region 204 connected to the emitter 102, a field plate region 205, an equipotential ring n region 203 at an edge of the chip, and an oxide isolation layer region 206.

The IGBT further includes a first drift region 108 under the cell region 100 and a second drift region 207 under the terminal region 200. The first drift region 108 and the second drift region 207 are jointly called an IGBT drift region, where the IGBT drift region is n−.

The IGBT further includes a collector metalization region 300 on a back surface of the chip and an IGBT collector region 301 which is connected to the IGBT drift region and under the IGBT drift region. The IGBT collector region 301 includes a p+ cell collector region 302 under the first drift region 108, a non-conductive isolation region 303 adjacent to the cell collector region 302, and a terminal collector region 304 adjacent to the non-conductive isolation region 303. The terminal collector region 304 includes a p type first block 304a and an n+ type second block 304b under the first block 304a. A length of the non-conductive isolation region 303 is smaller than or equal to a length of the terminal region 200, and a thickness of the non-conductive isolation region 303 is larger than or equal to a thickness of the cell collector region 302. A length of the first block 304a is smaller than or equal to the length of the terminal region 200, and a thickness of the first block 304a is smaller than a thickness of the second drift region 207. A length of the second block 304b is smaller than or equal to the length of the terminal region 200, and a thickness of the second block is smaller than the thickness of the non-conductive isolation region 303.

The first block 304a is p+ or p−; and the thickness of the second drift region 207 is preferably 30 μm to 600 μm.

As shown in FIG. 5, in a situation where a part of the non-conductive isolation region 303 is under the first drift region, in order not to affect a saturation voltage drop of the IGBT during operation, a length of the part of the non-conductive isolation region 303 under the first drift region 108 is preferably set to be no more than a length of three cells of the corresponding cell region 100 in the embodiment of the present invention.

If the shape of the non-conductive isolation region 303 is set to be non-rectangular, the shape of the first block 304a and that of the second block 304b also need to be adjusted correspondingly, which is not described herein again, as long as holes injected to the second drift region 207 under the terminal region 200 are decreased without affecting normal operation of the IGBT. In addition, when the shape of the first block 304a and that of the second block 304b are non-rectangular, a method for measuring the lengths and the thicknesses thereof is the same as a method for measuring the non-conductive isolation region 303, which is not described herein again.

Figure 6:
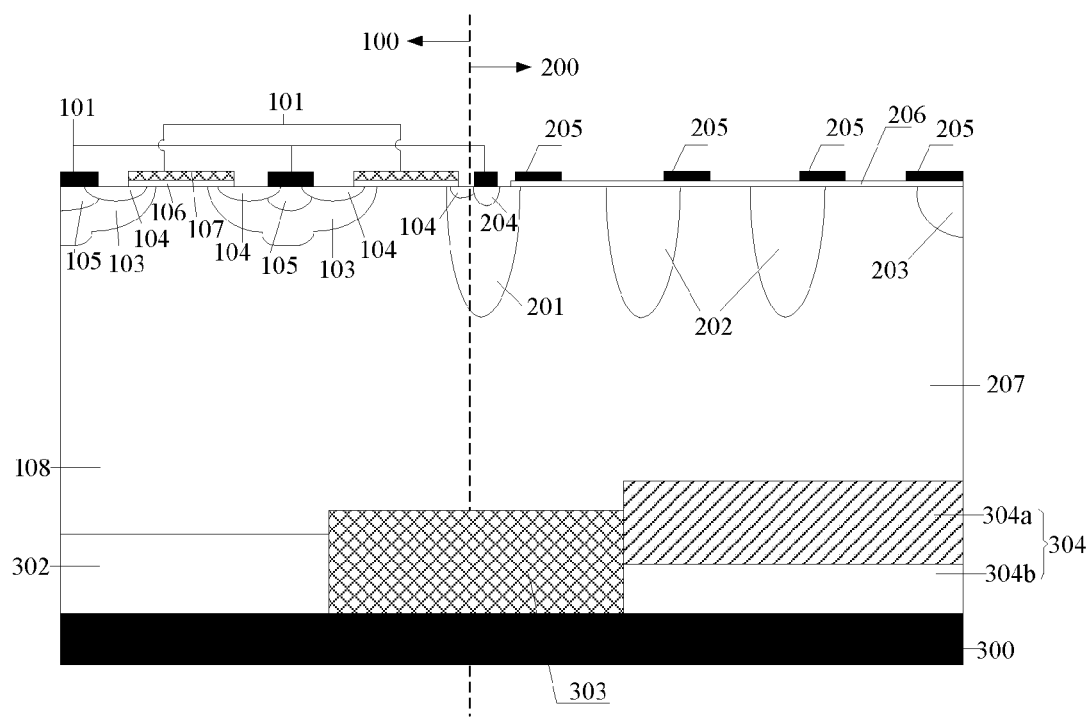
FIG. 6 is a schematic structural diagram of a planar gate type IGBT according to the second embodiment of the present invention.

Nevertheless, the second embodiment of the present invention further provides another IGBT. As shown in FIG. 6, a difference from FIG. 5 lies in that the IGBT in FIG. 6 is a planar gate type IGBT, which is not described herein again.

It should be noted that, FIG. 5 and FIG. 6 merely schematically illustrate relative positions, lengths, and thicknesses of the non-conductive isolation region 303, the first block 304*a*, and the second block 304*b*.

A turn-off feature of the IGBT provided by the embodiment of the present invention and that of the IGBT in the prior art are described hereinafter with reference to FIG. 7. It can be seen from a current-time relationship of an IGBT when it is turned off in FIG. 7 that a current of the IGBT provided by the embodiment of the present invention reaches 0 A in less than 0.000101 seconds, while a current of the IGBT in the prior art reaches 0 A in 0.000107 seconds. Meanwhile, it can be seen from a voltage-time relationship of the IGBT when it is turned off in FIG. 7 that a voltage of the IGBT provided by the embodiment of the present invention becomes stable in less than 0.000101 seconds, while a voltage of the IGBT in the prior art becomes stable in 0.000105 seconds. Therefore, it can be seen that a turn-off speed of the IGBT provided by the embodiment of the present invention is higher (a turn-off time may be decreased by 30%-80%), thereby reducing turn-off loss (which may be reduced by 30%).

Figure 8A:
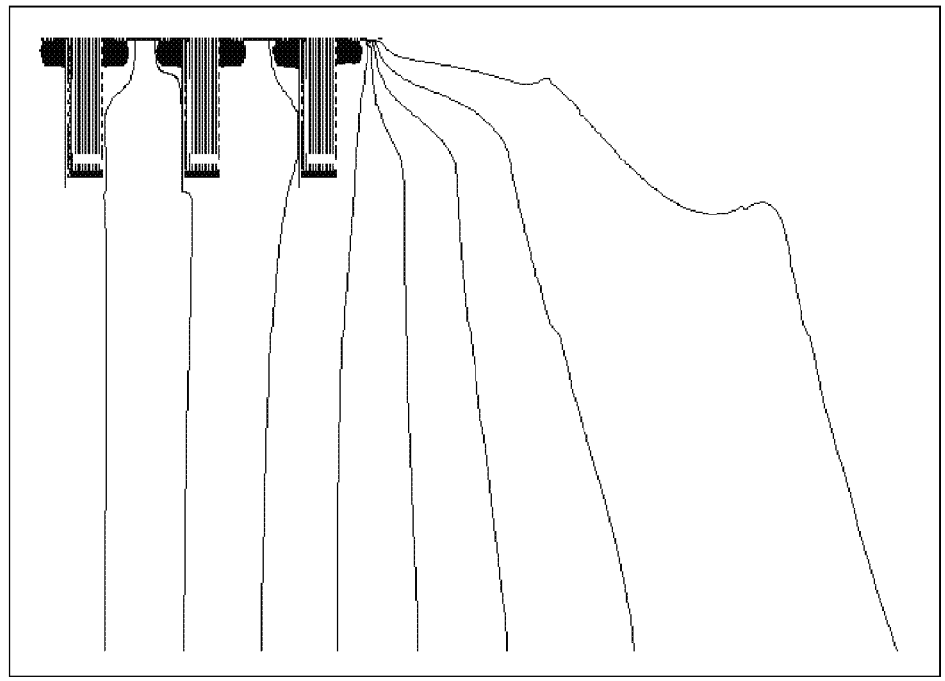
FIG. 8a is a first schematic diagram of current distribution when the IGBT in the prior art is turned off.
Figure 8B:
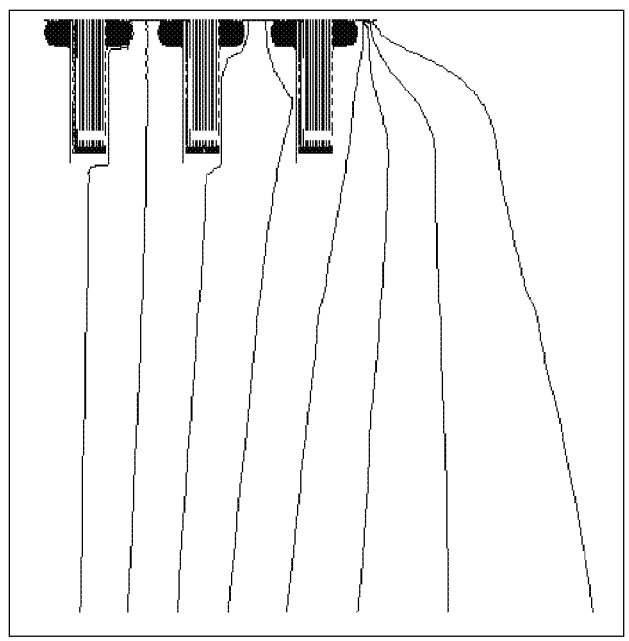
FIG. 8b is a first schematic diagram of current distribution when the IGBT according to the second embodiment of the present invention is turned off.
Figure 9A:
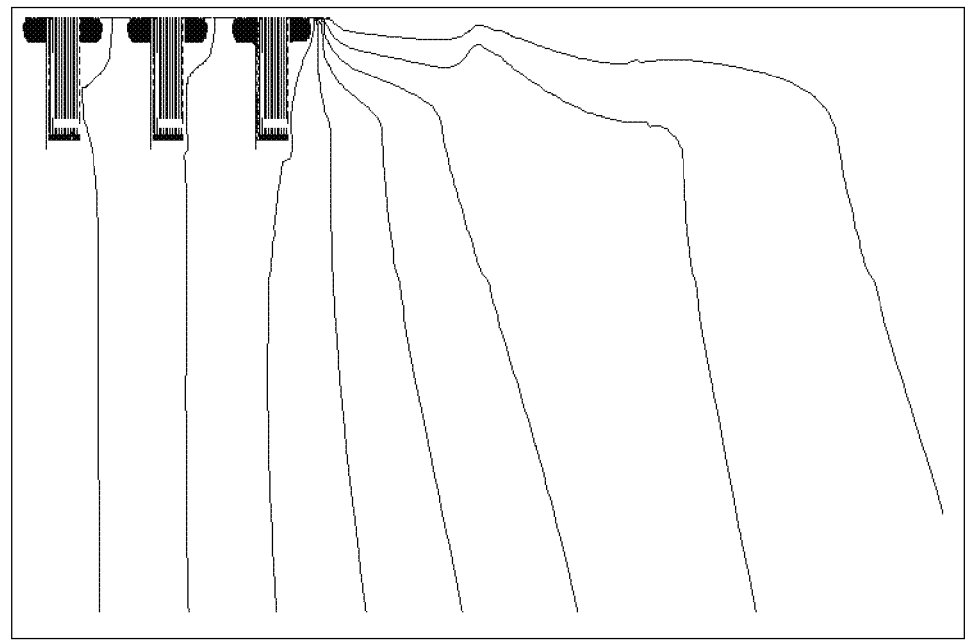
FIG. 9a is a second schematic diagram of current distribution when the IGBT in the prior art is turned off.
Figure 9B:
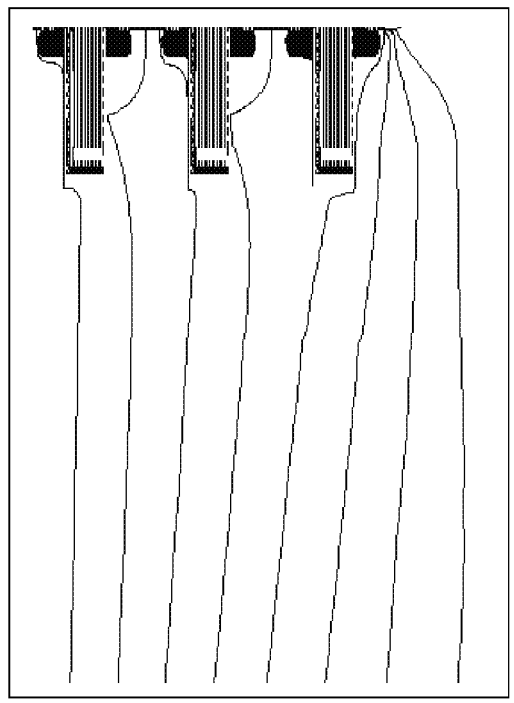
FIG. 9b is a second schematic diagram of current distribution when the IGBT according to the second embodiment of the present invention is turned off.

In addition, current distribution of the IGBT provided by the embodiment of the present invention and that of the IGBT in the prior art when the IGBTs are turned off are described hereinafter by comparison. FIG. 8*a* and FIG. 8*b* respectively are schematic diagrams of turn-off current distribution of the IGBT in the prior art and that of the IGBT provided by the embodiment of the present invention when a current between a collector and an emitter is $I_{CE}$=80 A. It can be seen from the diagrams that a turn-off current of the IGBT in the prior art mainly gathers at an equipotential ring, while current gathering is effectively reduced by the IGBT provided by the embodiment of the present invention, thereby improving turn-off reliability of the component. FIG. 9*a* and FIG. 9*b* respectively are schematic diagrams of turn-off current distribution of the IGBT in the prior art and that of the IGBT provided by the embodiment of the present invention when $I_{CE}$=55 A. It can be seen from the diagrams that a turn-off current of the IGBT in the prior art mainly gathers at the equipotential ring, while current gathering is effectively reduced by the IGBT provided by the embodiment of the present invention, thereby improving turn-off reliability of the component.

In the IGBT provided by the second embodiment of the present invention, the IGBT collector region includes a cell collector region 302, a non-conductive isolation region 303 adjacent to the cell collector region, and a terminal collector region 304 adjacent to the non-conductive isolation region. The terminal collector region 304 includes a p+ or p− first block 304*a* and an n+ second block 304*b* under the first block. In one aspect, the p+ or p− first block 304*a* can prevent a breakdown voltage of the IGBT from being affected, and ensure an appropriate IGBT current. In another aspect, due to the effect of the non-conductive isolation region 303 and the n+ of the second block 304*b*, an emission efficiency of holes in the first block 304*a* can be reduced, so that the holes injected to the second drift region 207 under the terminal region 200 are decreased, thereby reducing a turn-off time of hole recombination, and further reducing turn-off loss. In addition, a component can be prevented from being burned down as a result of a local gathering effect that forms a hole current at the equipotential ring, thereby improving turn-off reliability of the component.

Further optionally, the terminal collector region further includes a third block of the first conductivity type, which is adjacent to the first block and over the second block. A length of the third block is smaller than the length of the terminal region, and a thickness of the third block is equal to a thickness of the first block.

Further, a doping density of the first conductivity type (for example, n) of the third block is the same as a doping density of the IGBT drift region. In this way, the third block can be formed together with the IGBT drift region without increasing processing, thereby reducing the cost.

Here, the third block of the first conductivity type is disposed over the second block and adjacent to the first block. In one aspect, the first block of a second conductivity type can prevent a breakdown voltage of the IGBT from being affected, and ensure an appropriate IGBT current. In another aspect, due to the combined effect of the second block of a heavily doped first conductivity type (for example, n) and the third block of the first conductivity type, an emission efficiency of a majority of current carriers in the first block can be further reduced, so that holes injected to the second drift region under the terminal region are decreased, thereby further reducing a turn-off time of hole recombination, and further reducing turn-off loss. In addition, a component can be prevented from being burned down as a result of a local gathering effect that forms a hole current at the equipotential ring, thereby improving turn-off reliability of the component.

In addition, due to existence of the non-conductive isolation region, transmission of the hole current from the cell collector region to the first block can be effectively blocked when the IGBT is turned off, thereby further reducing the turn-off loss of the IGBT and improving the turn-off reliability.

Figure 10:
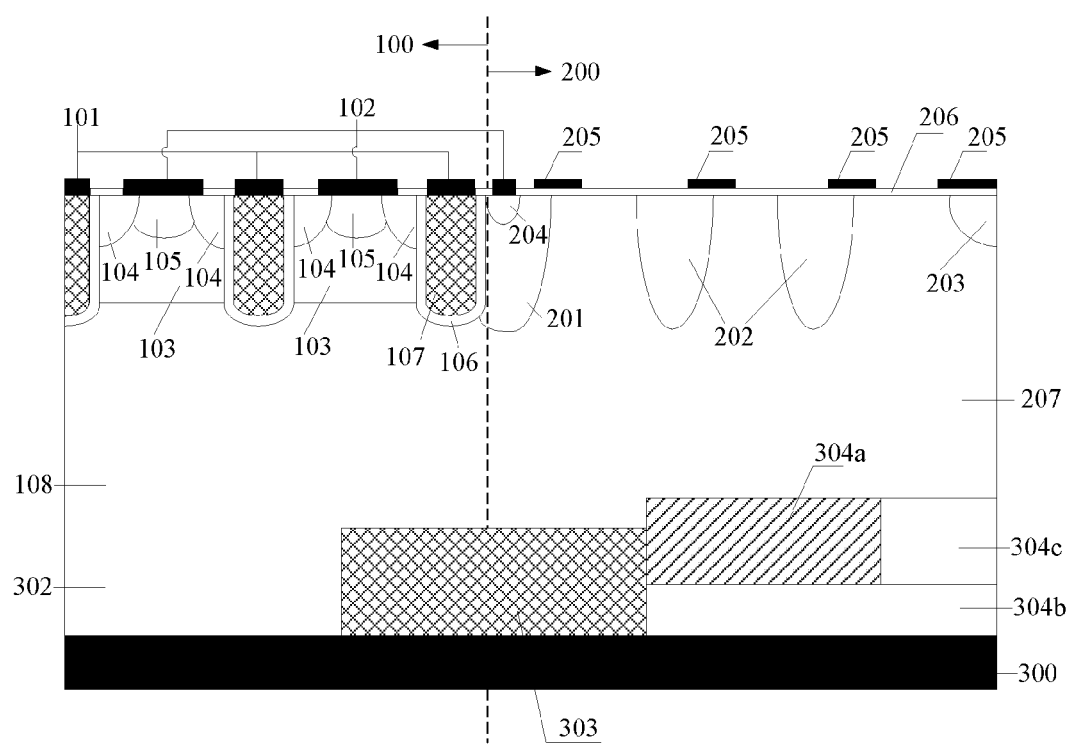
FIG. 10 is a schematic structural diagram of a trench gate type IGBT according to a third embodiment of the present invention.

In a third embodiment, as shown in FIG. 10, an IGBT provided by the third embodiment of the present invention includes a cell region 100 and a terminal region 200 surrounding the cell region. The cell region 100 includes a gate 101, an emitter 102, a p well region 103, an n+ emitter region 104 and a p+ emitter region 105 which are contained in the p well region 103 and contact the emitter, a trench type gate region 107, a gate oxidation region 106, and an oxide isolation layer 206. Multiple trench type gate regions 107 are connected together by using metal to form the gate 101 of the IGBT. The p well region 103, and the n+ emitter region 104 and the p+ emitter region 105 which are contained in the p well region 103, are connected together by using metal to form the emitter 102 of the IGBT. The terminal region 200 includes a first field ring p region 201, a number of field ring p regions 202, a p+region 204 connected to the emitter 102, a field plate region 205, an equipotential ring n region 203 at an edge of the chip, and an oxide isolation layer region 206.

The IGBT further includes a first drift region 108 under the cell region 100 and a second drift region 207 under the terminal region 200. The first drift region 108 and the second drift region 207 are jointly called an IGBT drift region, where the IGBT drift region is n−.

The IGBT further includes a collector metalization region 300 on a back surface of the chip and an IGBT collector region 301 which is connected to the IGBT drift region and under the IGBT drift region. The IGBT collector region 301 includes a p+ cell collector region 302 under the first drift region 108, a non-conductive isolation region 303 adjacent to the cell collector region 302, and a terminal collector region 304 adjacent to the non-conductive isolation region 303. The terminal collector region 304 includes a p type first block 304*a* and an n+ type second block 304*b* under the first block 304*a*, and an n− type third block 304*c* which is adjacent to the first block 304a and over the second block 304b. A length of the non-conductive isolation region 303 is smaller than or equal to a length of the terminal region 200, and a thickness of the non-conductive isolation region 303 is larger than or equal to a thickness of the cell collector region 302. A length of the first block 304a is smaller than or equal to a length of the terminal region 200, and a thickness of the first block 304a is smaller than a thickness of the second drift region 207. A length of the second block 304b is smaller than or equal to the length of the terminal region 200, and a thickness of the second block is smaller than the thickness of the non-conductive isolation region 303. A length of the third block 304c is smaller than the length of the terminal region 200, and a thickness of the third block 304c is equal to the thickness of the first block 304a.

The first block 304a is p+ or p−; and the thickness of the second drift region 207 is preferably 30 μm to 600 μm.

As shown in FIG. 10, in a situation where a part of the non-conductive isolation region 303 is under the first drift region 108, in order not to affect a saturation voltage drop of the IGBT during operation, a length of the part of the non-conductive isolation region 303 under the first drift region 108 is preferably set to be no more than a length of three cells of the corresponding cell region 100 in the embodiment of the present invention. Nevertheless, the non-conductive isolation region 303 may also be completely under the second drift region, which is not limited herein.

In addition, a shape of the third block 304c may be set according to a shape of the first block 304a and that of second block 304b, which is not limited herein. A method for measuring the lengths and the thicknesses thereof is the same as the method for measuring the non-conductive isolation region 303, which is not described herein again.

Figure 11:
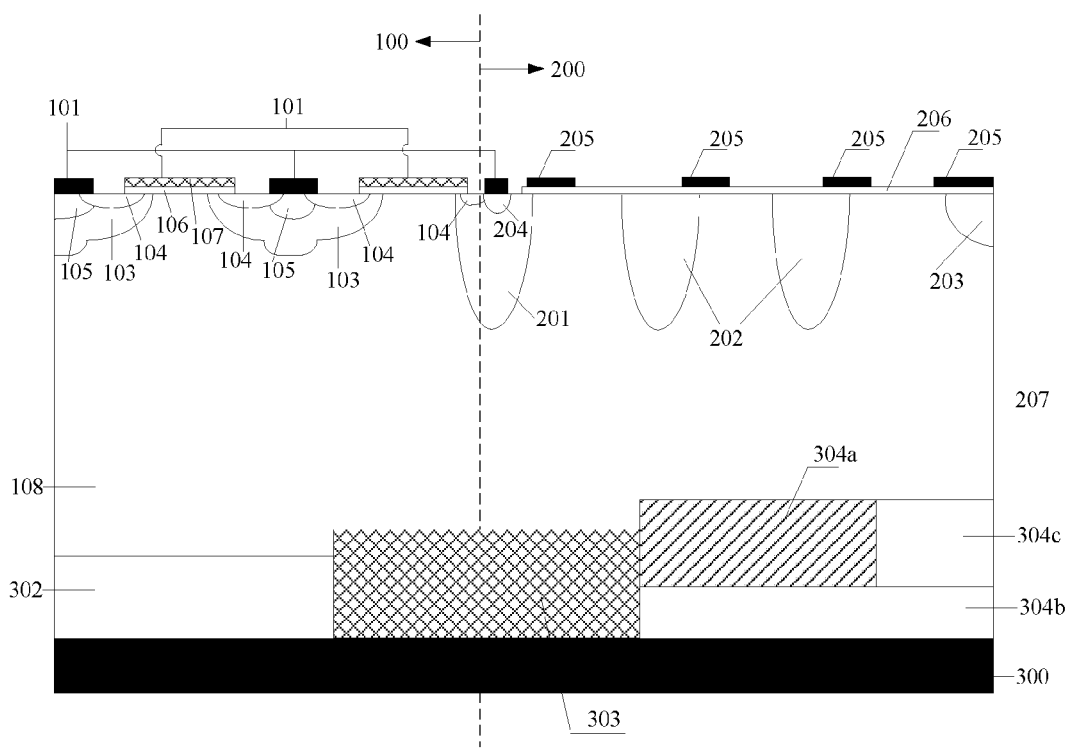
FIG. 11 is a schematic structural diagram of a planar gate type IGBT according to the third embodiment of the present invention.

Nevertheless, the third embodiment of the present invention further provides another IGBT. As shown in FIG. 11, a difference from FIG. 10 lies in that the IGBT in FIG. 11 is a planar gate type IGBT, which is not described herein again.

It should be noted that FIG. 10 and FIG. 11 merely schematically illustrate relative positions, lengths, and thicknesses of the non-conductive isolation region 303, the first block 304a, the second block 304b, and the third block 304c.

Figure 7:
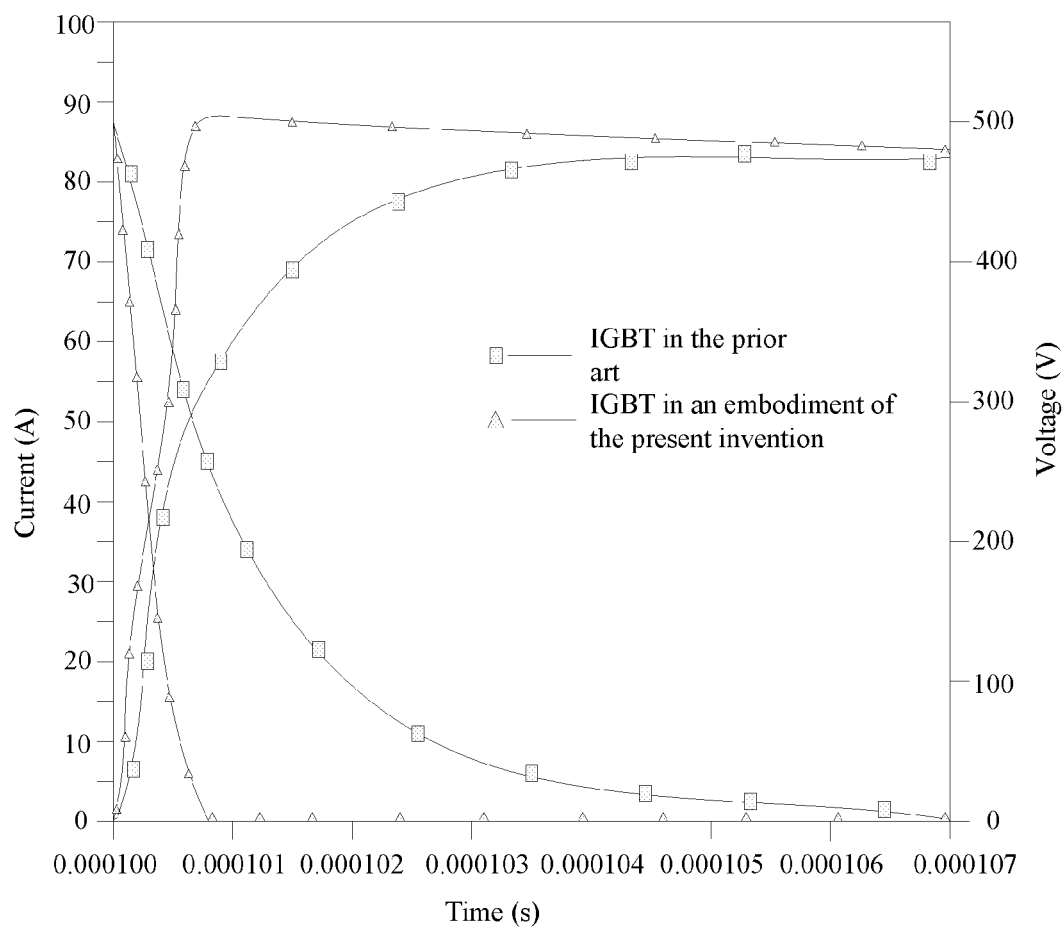
FIG. 7 is a schematic diagram of a turn-off feature of the IGBT according to the second embodiment of the present invention and that of the IGBT in the prior art.

As regards the turn-off feature of the IGBT, as shown in FIG. 7, in comparison with the turn-off feature of the IGBT in the prior art, the IGBT provided by the embodiment of the present invention also has a higher turn-off speed, so that the turn-off loss of the IGBT provided by the embodiment of the present invention is also smaller.

In addition, as shown in FIG. 8 to FIG. 9, by comparing the turn-off feature of the IGBT provided by the embodiment of the present invention and that of the IGBT in the prior art, the IGBT provided by the embodiment of the present invention may also effectively reduce current gathering, thereby improving turn-off reliability of the component.

In the IGBT provided by the third embodiment of the present invention, the IGBT collector region includes a cell collector region 302, a non-conductive isolation region 303 adjacent to the cell collector region, and a terminal collector region 304 adjacent to the non-conductive isolation region. The terminal collector region 304 includes a p+ or p− type first block 304a, an n+ type second block 304b under the first block, and an n− type third block 304c which is adjacent to the first block and over the second block. In one aspect, the p+ or p− first block 304a can prevent a breakdown voltage of the IGBT from being affected, and ensure an appropriate IGBT current. In another aspect, due to the effect of the non-conductive isolation region 303, the n+ type second block 304b, and the n− type third block 304c, an emission efficiency of holes in the first block 304a may be reduced to a maximum extent, so that the holes injected to the second drift region 207 under the terminal region 200 are decreased, thereby further reducing a turn-off time of hole recombination, and further reducing turn-off loss. In addition, a component can be prevented from being burned down as a result of a local gathering effect that forms a hole current at the equipotential ring, thereby improving turn-off reliability of the component.

It should be noted that, in all foregoing embodiments, the IGBT of the present invention may be a non-punch-through (full name: Non-punch-through, briefed as NPT) IGBT, or a field stop (full name: Field stop, briefed as FS) IGBT, or a slightly punch-through (full name: Slightly punch-through, briefed as SPT) IGBT, all of which belong to the prior art, which is not described herein again.

The foregoing descriptions are merely specific embodiments of the present invention, but are not intended to limit the protection scope of the present invention. Any variation or replacement readily figured out by a person skilled in the art within the technical scope disclosed in the present invention shall fall within the protection scope of the present invention. Therefore, the protection scope of the present invention shall be subject to the appended claims.

What is claimed is:

1. An insulated gate bipolar transistor IGBT, comprising:
a cell region on a front surface;
a terminal region surrounding the cell region;
an IGBT drift region of a first conductivity type; and
an IGBT collector region on a back surface, wherein: the IGBT collector region is connected to the IGBT drift region and under the IGBT drift region, and the IGBT drift region comprises a first drift region under the cell region and a second drift region under the terminal region; and
the IGBT collector region comprises a cell collector region of a heavily doped second conductivity type under the first drift region and a non-conductive isolation region adjacent to the cell collector region, wherein a length of the non-conductive isolation region is smaller than or equal to a length of the terminal region, and a thickness of the non-conductive isolation region is larger than or equal to a thickness of the cell collector region.

2. The IGBT according to claim 1, wherein the IGBT collector region further comprises a terminal collector region adjacent to the non-conductive isolation region, wherein the terminal collector region comprises a first block of a second conductivity type and a second block of a heavily doped first conductivity type under the first block, wherein: a length of the first block is smaller than or equal to the length of the terminal region, and a thickness of the first block is smaller than a thickness of the second drift region; and a length of the second block is smaller than or equal to the length of the terminal region, and a thickness of the second block is smaller than the thickness of the non-conductive isolation region.

3. The IGBT according to claim 2, wherein a doping density of the second conductivity type of the first block is light doping or heavy doping.

4. The IGBT according to claim 2, wherein the terminal collector region further comprises a third block of the first conductivity type, which is adjacent to the first block and over the second block, wherein a length of the third block is smaller than the length of the terminal region, and a thickness of the third block is equal to the thickness of the first block.

5. The IGBT according to claim 4, wherein a doping density of the first conductivity type of the third block is the same as a doping density of the IGBT drift region.

6. The IGBT according to claim 1 wherein, in a situation where a part of the non-conductive isolation region is under the first drift region, a length of the part of the non-conductive isolation region under the first drift region is no more than a length of three cells of a corresponding cell region.

7. The IGBT according to claim 1, wherein the non-conductive isolation region is in a shape of a rectangle, trapezoid, or triangle.

8. The IGBT according to claim 1, wherein a filling material of the non-conductive isolation region comprises silicon dioxide, or silicon nitride, or a mixture of silicon dioxide and silicon nitride, or a compound of nitride, silicon, and oxygen, or a non-conductive organic matter.

9. The IGBT according to claim 1, wherein the IGBT is a planar gate IGBT or a trench gate IGBT.

10. The IGBT according to claim 1, wherein the first conductivity type is n type, and the second conductivity type is p type.

11. The IGBT according to claim 1, wherein when the IGBT is turned off, a current of the IGBT reaches 0 A in less than approximately 0.000101 seconds.

12. The IGBT according to claim 1, wherein when the IGBT is turned off, a voltage of the IGBT becomes stable in less than approximately 0.000101 seconds.

* * * * *